United States Patent
Avila et al.

(10) Patent No.: US 9,218,890 B2
(45) Date of Patent: Dec. 22, 2015

(54) ADAPTIVE OPERATION OF THREE DIMENSIONAL MEMORY

(71) Applicant: SanDisk Technologies Inc., Plano, TX (US)

(72) Inventors: Chris Nga Yee Avila, Saratoga, CA (US); Gautam Ashok Dusija, Milpitas, CA (US); Jian Chen, Menlo Park, CA (US); Yingda Dong, San Jose, CA (US); Man Lung Mui, Fremont, CA (US); Seungpil Lee, San Ramon, CA (US); Alexander Kwok-Tung Mak, Los Altos Hills, CA (US)

(73) Assignee: SanDisk Technologies Inc., Plano, TX (US)

( * ) Notice: Subject to any disclaimer, the term of this patent is extended or adjusted under 35 U.S.C. 154(b) by 263 days.

(21) Appl. No.: 13/908,921

(22) Filed: Jun. 3, 2013

(65) Prior Publication Data
US 2014/0355344 A1   Dec. 4, 2014

(51) Int. Cl.
| G11C 11/34 | (2006.01) |
| G11C 16/34 | (2006.01) |
| G11C 29/04 | (2006.01) |
| G06F 11/10 | (2006.01) |
| G06F 11/14 | (2006.01) |

(52) U.S. Cl.
CPC ........ *G11C 16/3404* (2013.01); *G06F 11/1048* (2013.01); *G06F 11/1497* (2013.01); *G11C 29/04* (2013.01)

(58) Field of Classification Search
CPC   G11C 16/3404; G11C 29/04; G06F 11/1048; G06F 11/1497

USPC .................. 365/185.09, 185.11, 189.011
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,532,962 | A | 7/1996 | Auclair et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,301,807 | B2 | 11/2007 | Khalid et al. |

(Continued)

OTHER PUBLICATIONS

Final Office Action for U.S. Appl. No. 14/281,404 mailed Jan. 29, 2015, 17 pages.
Notice of Allowance issued for U.S. Appl. No. 14/281,404 mailed on Apr. 13, 2015, 7 pages.

(Continued)

*Primary Examiner* — Richard Elms
*Assistant Examiner* — Mohammed A Bashar
(74) *Attorney, Agent, or Firm* — Davis Wright Tremaine LLP

(57) ABSTRACT

When data from a portion of a three dimensional NAND memory array is determined to be uncorrectable by Error Correction Code (ECC), a determination is made as to whether data is uncorrectable by ECC throughout some unit that is larger than the portion. If modified read conditions provide ECC correctable data, the modified read conditions are recorded for subsequent reads of the larger unit.

38 Claims, 12 Drawing Sheets

(56) References Cited

U.S. PATENT DOCUMENTS

| | | |
|---|---|---|
| 7,954,037 B2 | 5/2011 | Lasser et al. |
| 2011/0131473 A1 | 6/2011 | Mokhlesi et al. |
| 2011/0239088 A1 | 9/2011 | Post |
| 2012/0265927 A1 | 10/2012 | Cho et al. |
| 2012/0268994 A1* | 10/2012 | Nagashima ............ 365/185.11 |
| 2013/0003480 A1* | 1/2013 | D'Abreu et al. ............ 365/218 |
| 2013/0055012 A1 | 2/2013 | Roh |
| 2013/0073924 A1 | 3/2013 | D'Abreu et al. |
| 2013/0080858 A1 | 3/2013 | Lee et al. |

OTHER PUBLICATIONS

Office Action for U.S. Appl. No. 14/281,404 mailed Sep. 18, 2014, 19 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

International Search Report and Written Opinion of the International Searching Authority issued for International Application No. PCT/US2014/036664 mailed Apr. 17, 2015, 20 pages.

\* cited by examiner

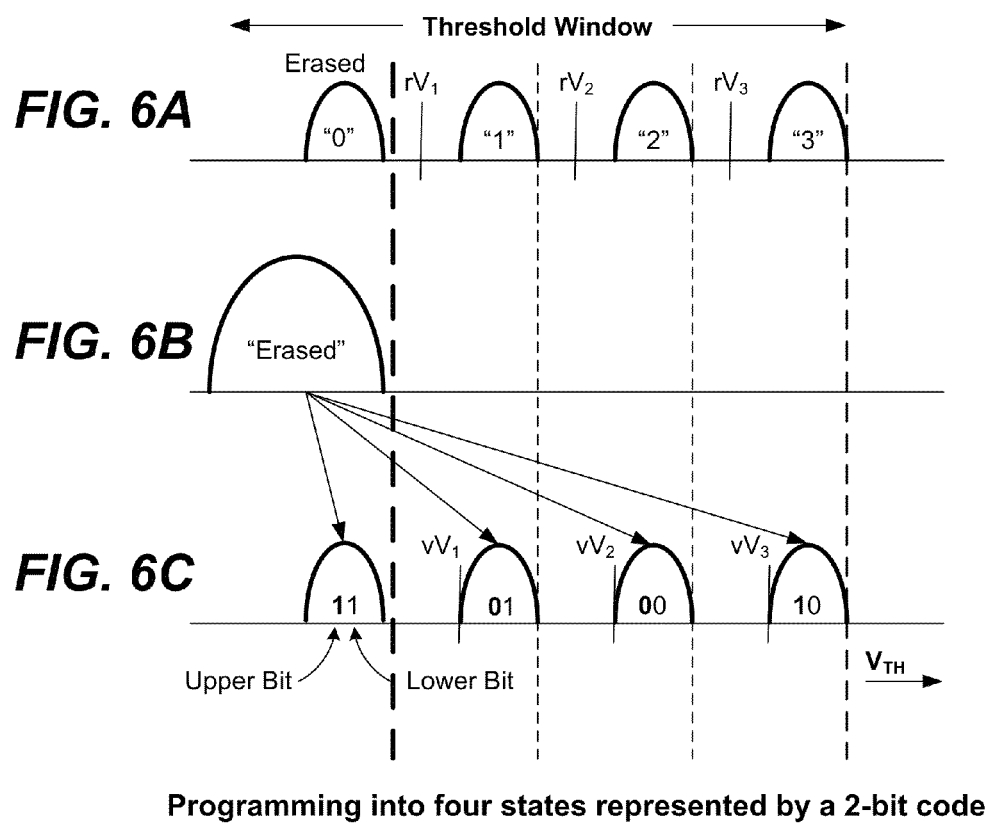

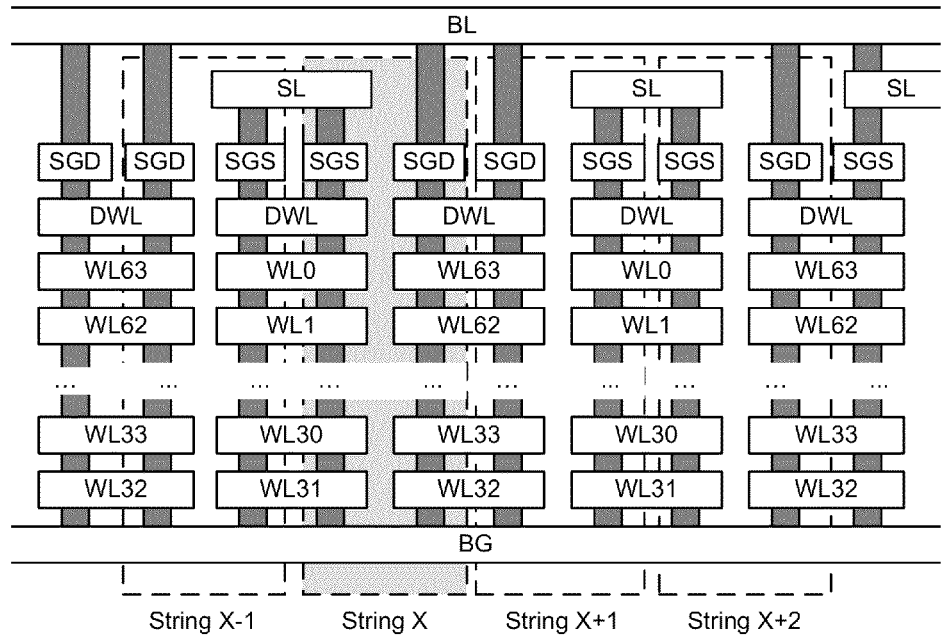
FIG. 10
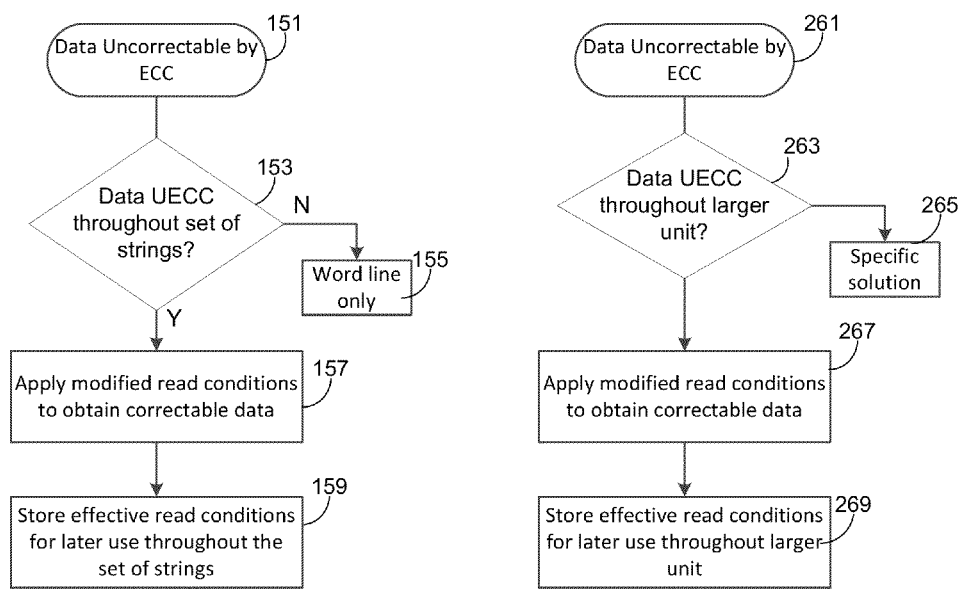
FIG. 11  FIG. 12

ADAPTIVE OPERATION OF THREE DIMENSIONAL MEMORY

BACKGROUND

This application relates to the operation of three dimensional re-programmable non-volatile memory systems and to systems and methods for dealing with data errors in such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into its memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row, or word line typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A three dimensional nonvolatile memory has certain identifiable failure modes that may cause data to be uncorrectable by Error Correction Code (UECC). Because of the physical structure of a 3-D nonvolatile memory, certain failure modes may affect relatively large physical areas of a memory (larger than a single word line). For example, data may be UECC throughout a set of word lines that are selected together by a select line. Data may be UECC throughout a block. Where pairs or groups of blocks share block select circuits, data may be UECC throughout such a pair or group. When UECC data is encountered along a particular word line, a determination may be made as to whether data is UECC throughout a larger unit such as a set of strings, a block, or a group of blocks. Different read conditions may be used to attempt to read the data. If successful read conditions are found then the successful read conditions may be stored for future use in the unit.

An example of a method of operating a three dimensional nonvolatile NAND memory includes: applying a first set of read conditions to read a first portion of a block to obtain first data; performing Error Correction Code (ECC) decoding of the first data; determining that the first data is uncorrectable by ECC; in response to determining that the first data in the first portion of the block is uncorrectable by ECC, determining whether a larger unit within the three dimensional NAND memory, that is larger than the first portion of the block, is uncorrectable by ECC when read using the first set of read conditions, the larger unit consisting of: (i) a plurality of blocks, including the block, that share block select circuits, (ii) the block, or (iii) a set of strings within the block that are selected together by a common select line; if the stored data is uncorrectable by ECC throughout the larger unit, then applying modified read conditions to the first portion of the block to find a second set of read conditions that provide second data that is correctable by ECC; and returning corrected second data and recording the second set of read conditions for subsequent reads of data of the larger unit.

The first set of read conditions may include a first read voltage applied to a selected word line and the second set of read conditions may include a second read voltage applied to the selected word line, the second read voltage being different to the first read voltage. The first set of read conditions may include a first read-pass voltage applied to unselected word lines and the second set of read conditions may include a second read-pass voltage applied to the unselected word lines, the second read-pass voltage being different to the first read-pass voltage. The first set of read conditions may include a first select voltage applied to a select line and the second set of read conditions may include a second select voltage applied to the select line, the second select voltage being different to the first select voltage. The first set of read conditions may include a first unselect voltage applied to a select line of an unselected set of strings and the second set of read conditions may include a second unselect voltage applied to the select line of the unselected set of strings, the second unselect voltage being different to the first unselect voltage. The first set of read conditions may include a first read-pass voltage applied to a dummy word line and the second set of read conditions may include a second read-pass voltage applied to the dummy word line. The first set of read conditions may include a first voltage provided to a host data word line, a dummy word line, and/or a select line of an unselected block that shares block select circuits with the block and the second set of read conditions may include a second voltage provided to the host data word line, the dummy word line, and/or the select line of the unselected block, the second voltage being different to the first voltage. The first and second voltages may be provided to word lines of the unselected block and the second voltage may be higher than the first voltage. If more than a threshold number of modified read conditions are applied to the first portion of the block without finding the second set of read conditions that provide second data that is correctable by ECC, then data of the first portion of the block may be recovered from redundancy data stored in other blocks.

An example of a method of operating a three dimensional nonvolatile NAND memory in which each block includes a plurality of strings connected to each bit line, each string along a bit line being selectable by a different select line so that an individual select line selects a set of strings of different bit lines, includes: applying a first set of read conditions to read a selected word line of a selected set of strings to obtain first data; performing Error Correction Code (ECC) decoding of the first data; determining that the first data is uncorrectable by ECC; in response to determining that the first data is uncorrectable by ECC, determining whether stored data is uncorrectable throughout the selected set of strings; if the stored data is uncorrectable throughout the selected set of strings, then applying modified read conditions to the first portion of the block to find a second set of read conditions that provide second data that is correctable by ECC; and returning corrected second data and recording the second set of read conditions for subsequent reads of data in the first set of strings.

Determining whether stored data is uncorrectable throughout the selected set of strings may include attempting to read one or more additional word lines within the selected set of strings using the first set of read conditions. A further determination may be made as to whether stored data in a block containing the selected set of strings is uncorrectable by ECC throughout the block when read using the first set of read conditions. If stored data is uncorrectable by ECC throughout the selected set of strings, and is not uncorrectable by ECC throughout the block when read using the first set of read conditions, then the second set of read conditions may be recorded for subsequent reads of data in the first set of strings while maintaining the first set of read conditions for subsequent reads of other sets of strings in the block.

An example of a method of operating a three dimensional nonvolatile NAND memory includes: applying a first set of read conditions to read a first portion of a block to obtain first data; performing Error Correction Code (ECC) decoding of the first data; determining that the first data is uncorrectable by ECC; in response to determining that the first data is uncorrectable by ECC, determining whether stored data is uncorrectable by ECC throughout a plurality of blocks, including the block, that share block select circuits; if the stored data is uncorrectable by ECC throughout the plurality of blocks, then applying modified read conditions to the first portion of the block to find a second set of read conditions that provide second data that is correctable by ECC; and returning corrected second data and recording the second set of read conditions for subsequent reads of data throughout the plurality of blocks that share block select circuits.

The first set of read conditions may include a first voltage provided to a host data word line, a dummy word line, and/or a select line of an unselected block of the plurality of blocks and the second set of read conditions may include a second voltage provided to the host data word line, the dummy word line, and/or the select line of the unselected block, the second voltage being different to the first voltage. The first voltage and the second voltage may be provided to a word line of the unselected block and the second voltage may be higher than the first voltage. The first voltage and the second voltage may be provided to a select line of the unselected block and the second voltage may be higher than the first voltage.

An example of a three dimensional nonvolatile NAND memory system includes: a three dimensional nonvolatile NAND memory array; Error Correction Code (ECC) circuits that decode data read from a portion of a block of the nonvolatile NAND memory array; determination circuits that, in response to determining that the data read from the portion of the block is uncorrectable by ECC when read using a first set of read conditions, determine whether data throughout a larger unit within the three dimensional nonvolatile NAND memory array, that is larger than the portion of the block, is uncorrectable by ECC when read using the first set of read conditions, the larger unit consisting of: (i) a plurality of blocks, including the block, that share block select circuits, (ii) the block, or (iii) a set of strings within the block that are selected together by a common select line; adaptive read circuits configured to apply modified read conditions to find a second set of read conditions that provide data that is correctable by ECC if data is uncorrectable by ECC throughout the larger unit when read using the first set of read conditions; and recording circuits that record the second set of read conditions for subsequent reads of data of the larger unit.

The three dimensional nonvolatile NAND memory array may be located on a memory die and the recording circuits may be located on a separate memory controller die. The recording circuits may be implemented on the memory controller die using firmware. The first set of read conditions may include a first read voltage applied to a selected word line and the second set of read conditions may include a second read voltage applied to the selected word line, the second read voltage being different to the first read voltage. The first set of read conditions may include a first read-pass voltage applied to unselected word lines and the second set of read conditions may include a second read-pass voltage applied to the unselected word lines, the second read-pass voltage being different to the first read-pass voltage. The first set of read conditions may include a first select voltage applied to a select line and the second set of read conditions may include a second select voltage applied to the select line, the second select voltage being different to the first select voltage. The first set of read conditions may include a first unselect voltage applied to a select line of an unselected set of strings and the second set of read conditions may include a second unselect voltage applied to the select line of the unselected set of strings, the second unselect voltage being different to the first unselect voltage. The first set of read conditions may include a first read-pass voltage applied to a dummy word line and the second set of read conditions may include a second read-pass voltage applied to the dummy word line. The first set of read conditions may include a first voltage provided to a host data word line, a dummy word line, and/or a select line of an unselected block that shares block select circuits with the block and the second set of read conditions may include a second voltage provided to the host data word line, the dummy word line, and/or the select line of the unselected block, the second voltage being different to the first voltage.

The first and second voltages may be provided to word lines of the unselected block and the second voltage may be higher than the first voltage. If more than a threshold number of modified read conditions are applied to the first portion of the block without finding the second set of read conditions that provide second data that is correctable by ECC, then data of the first portion of the block may be recovered from redundancy data stored in other blocks.

An example of a three dimensional nonvolatile NAND memory system includes: a plurality of individually erasable blocks, a block including a plurality of strings connected to each bit line of the block, each string along a bit line being selectable by a different select line so that an individual select line selects a set of strings of different bit lines; Error Correction Code (ECC) circuits that decode data read from a portion of a selected set of strings of a selected block; determination circuits that, in response to determining that the portion of data is uncorrectable by ECC when read using a first set of read conditions, further determine whether stored data is uncorrectable throughout the selected set of strings; adaptive read circuits that apply modified read conditions to find a second set of read conditions that provide data that is correctable by ECC; and recording circuits that record the second set of read conditions for subsequent reads of data in the selected set of strings.

The plurality of individually erasable blocks may be located on a memory die and the recording circuits may be located on a separate memory controller die. The determination circuits may further determine whether stored data is uncorrectable by ECC throughout the selected set of strings by attempting to read one or more portions within the selected set of strings using the first set of read conditions. The determination circuits may further determine whether stored data in a block containing the selected set of strings is uncorrectable by ECC throughout the block when read using the first set of read conditions. If stored data is uncorrectable by ECC throughout the selected set of strings, and is not uncorrectable by ECC throughout the block when read using the first set of read conditions, the second set of read conditions may be recorded by the recording circuits for subsequent reads of data in the first set of strings while the first set of read conditions is maintained for subsequent reads of other sets of strings in the block.

An example of a three dimensional nonvolatile NAND memory system includes: a plurality of individually erasable blocks that are configured in selectable units of two or more blocks that share block select circuits; Error Correction Code (ECC) circuits that decode data read from a portion of a selected block in a selectable unit; determination circuits that, in response to determining that the portion of data is uncorrectable by ECC when read using a first set of read conditions, further determine whether stored data is uncorrectable throughout the selectable unit that contains the selected block; adaptive read circuits that apply modified read conditions to find a second set of read conditions that provide data that is correctable by ECC; and recording circuits that record the second set of read conditions for subsequent reads of data in the selectable unit that contains the selected block.

The plurality of individually erasable blocks may be located on a memory die and the recording circuits may be located on a separate memory controller die. The first set of read conditions may include a first voltage provided to a host data word line, a dummy word line, and/or a select line of an unselected block of the selectable unit and the second set of read conditions may include a second voltage provided to the host data word line, the dummy word line, and/or the select line of the unselected block, the second voltage being different to the first voltage. The first voltage and the second voltage may be provided to a word line of the unselected block and the second voltage may be higher than the first voltage. The first voltage and the second voltage may be provided to a select line of the unselected block and the second voltage may be higher than the first voltage.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of 4-state memory cells.

FIG. 10 shows an individual set of strings "String X" that is determined to contain UECC data throughout the set of strings.

FIG. 11 illustrates a method of dealing with UECC data of a set of strings in a block of 3-D memory.

FIG. 12 illustrates a method of dealing with UECC data in a 3-D memory array.

DETAILED DESCRIPTION

Memory System

Figure 1:
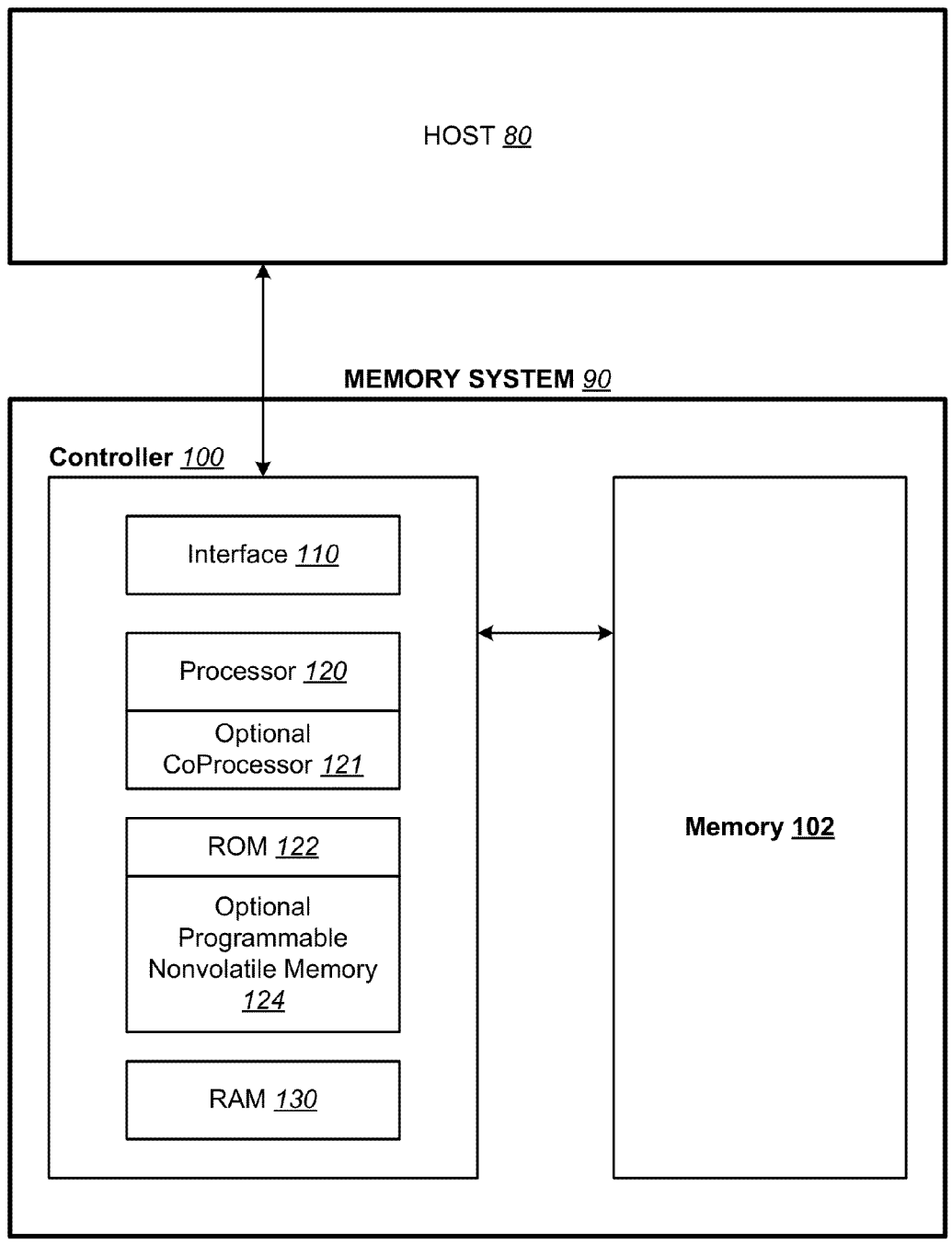
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
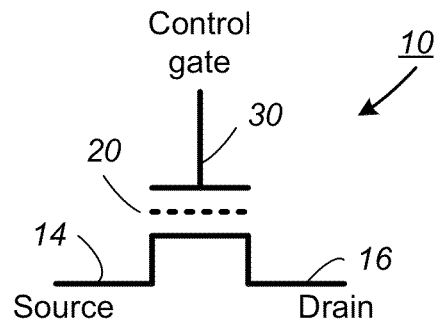
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
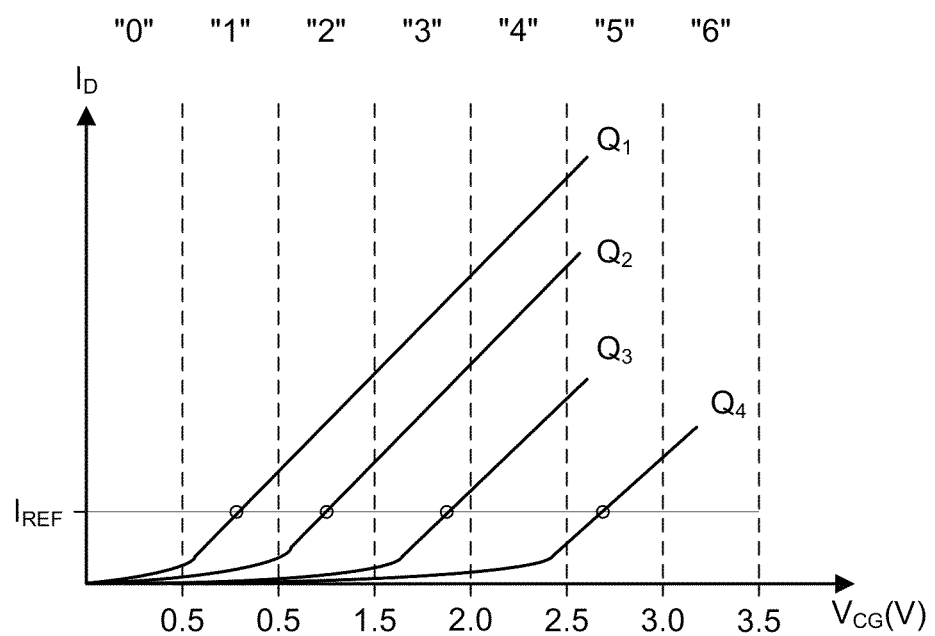
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four charge levels that can be programmed on a floating gate of a memory cell, respectively corresponding to four of eight possible memory states. As an example, the threshold voltage window of a population of cells may range from 0.5V to 3.5V. Seven programmed memory states "0", "1", "2", "3", "4", "5", "6", respectively, and one erased state (not shown), may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
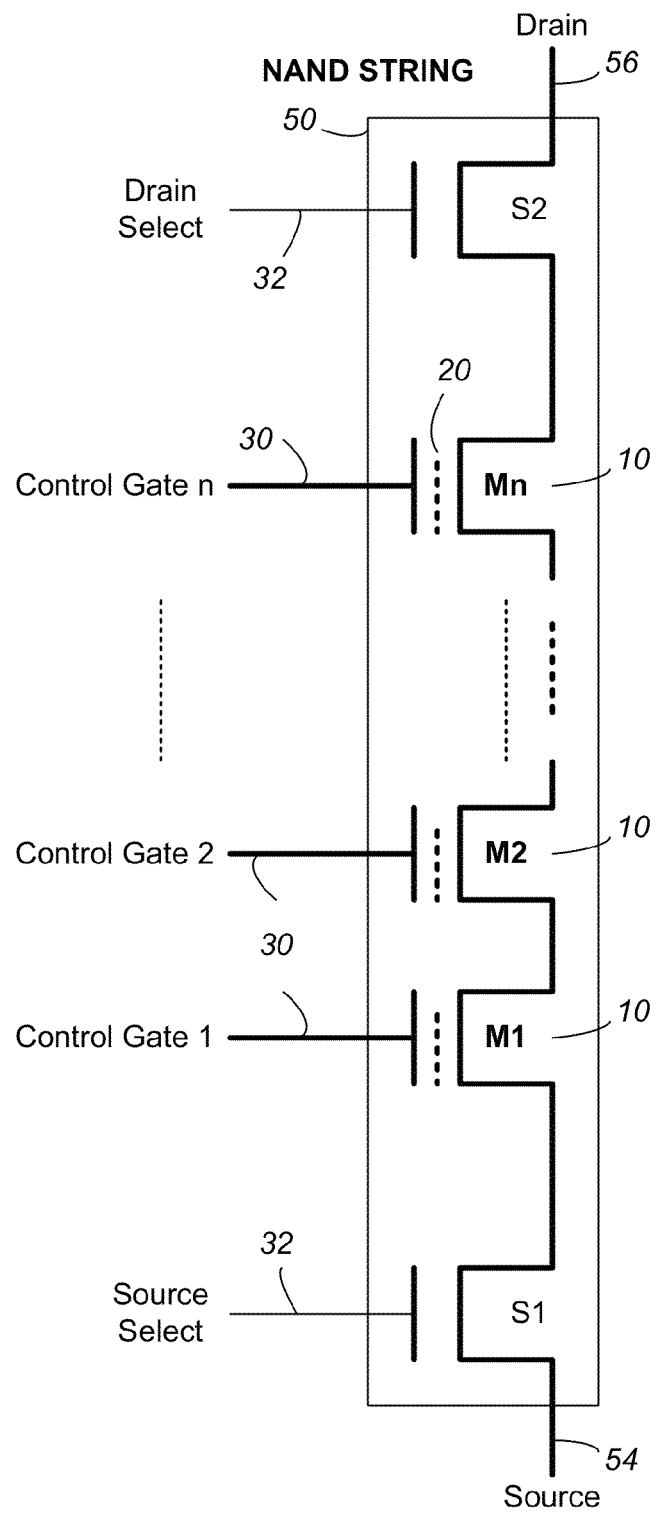
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
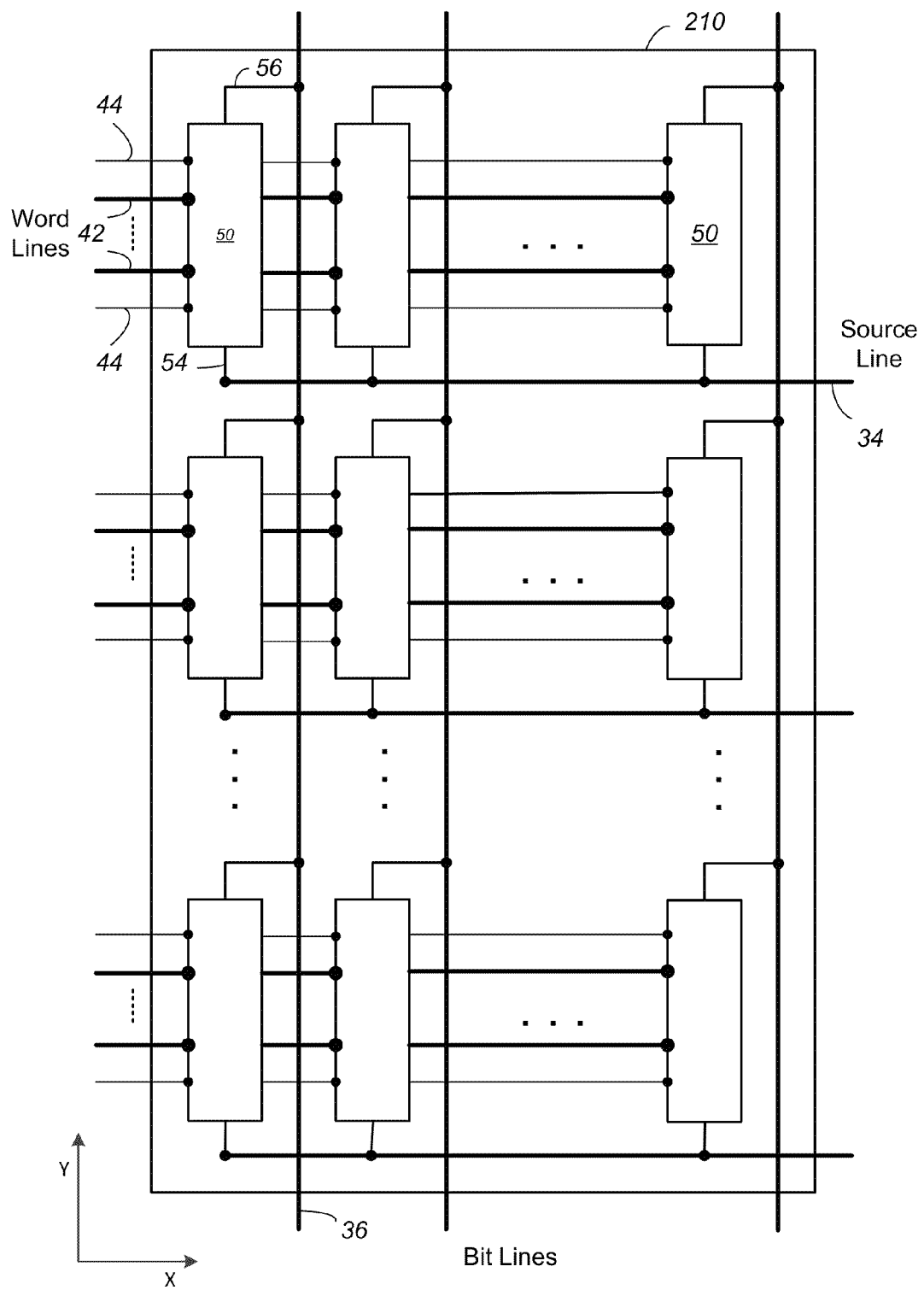
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
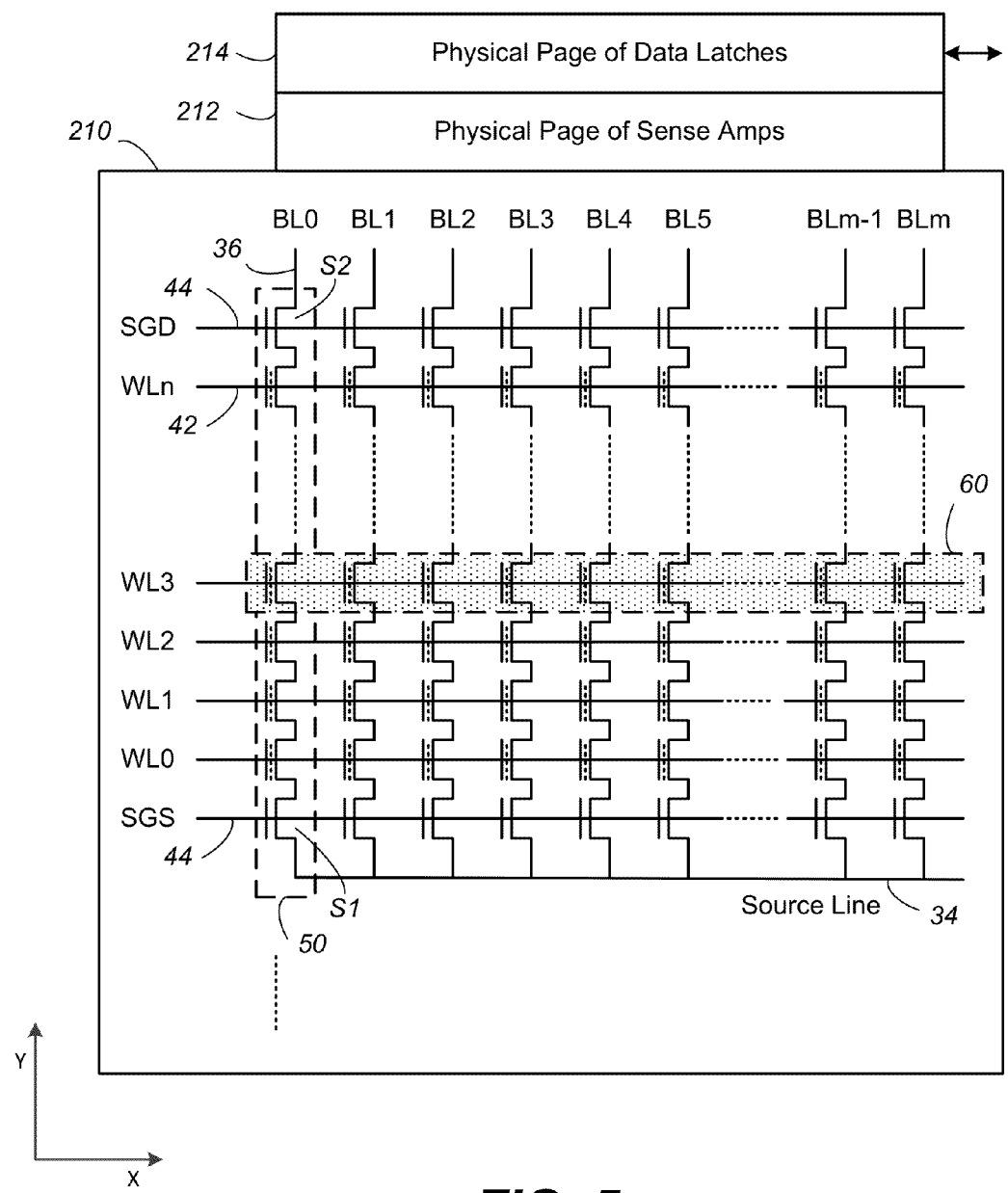
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
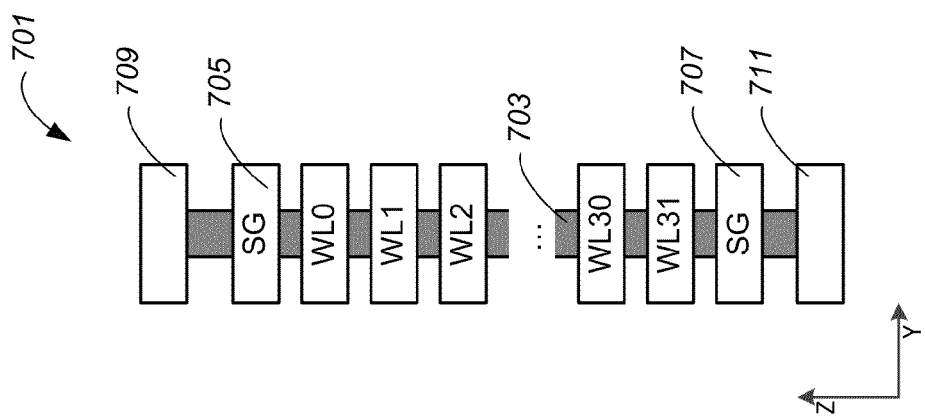
FIG. 7 illustrates an example of a NAND string that extends vertically from a substrate in the z-direction.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by funning stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
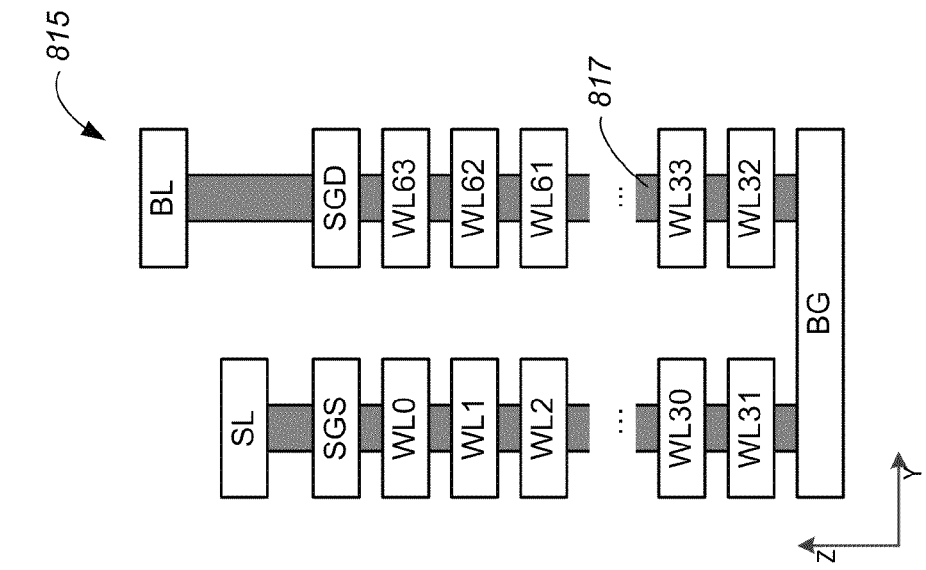
FIG. 8 illustrates another example of a NAND string that extends vertically from a substrate in the z-direction.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two sides of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
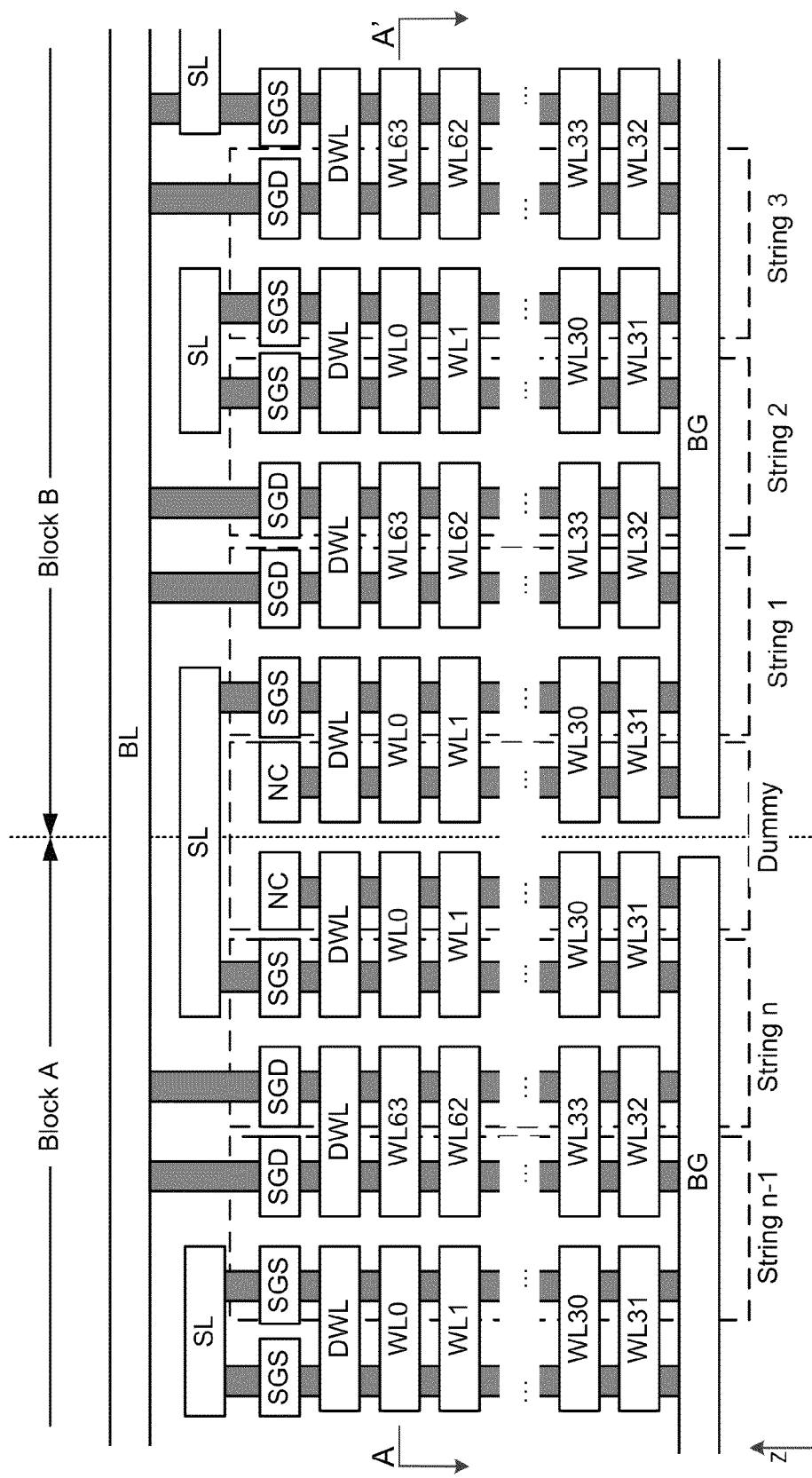
FIG. 9A shows an example of a 3-D NAND memory array in cross section along the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines that extend along the y-direction, and are separated from each other along the x-direction (e.g. are behind the bit line shown in FIG. 9A). Word lines extend along the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SOD, SOS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). Half a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Figure 9B:
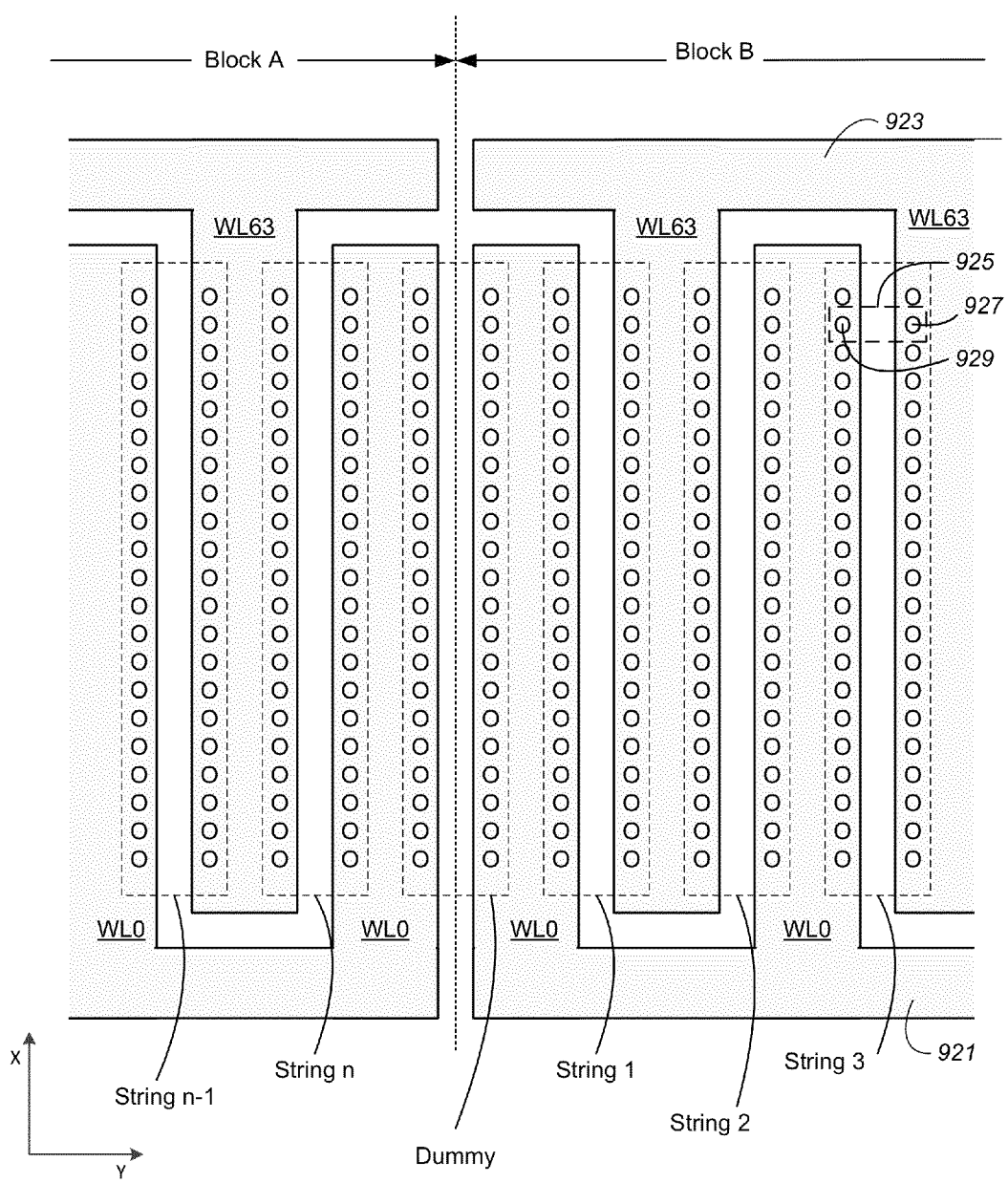
FIG. 9B shows the 3-D NAND memory array of FIG. 9A in cross section along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines.

Word line drivers are connected to supply appropriate voltages to connected word lines of a block (e.g. to bodies 923 and 921) so that a word line of the block can be accessed (e.g. programmed or read). Select line drivers are connected to supply appropriate voltages to select lines so that a particular set of strings in a block is selected.

Because there are multiple strings along a bit line within a block, it is necessary to specify a particular string when accessing (e.g. reading or programming) the memory. While in 2-D NAND, specifying a block and word line (or portion of a word line) is generally sufficient to specify unique data, in a 3-D structure such as shown above, there may be n different portions of stored data for a given block and word line (where n is the number of strings along a bit line in a block). A set of strings that are selectable together within a block is a unit that is intermediate in size between a single word line and a block. Such a unit arises from particular 3-D memory structures such as the one shown in FIGS. 9A and 9B.

Uncorrectable Data

It is common in memory systems to encode data prior to storage using an Error Correction Code (ECC) scheme. When such data is read it is decoded and errors in the read data may be corrected up to some limit. The limit generally depends on the ECC scheme used and in particular on the amount of redundancy added. While a small number of bad bits may be corrected by ECC, large numbers of bad bits may be uncorrectable by ECC ("UECC") so that some other approach is needed.

In some cases, data that is read from a memory array using one set of read conditions may be found to be UECC. If the data is read again from the memory array using a different set of read conditions, the data may be correctable by ECC (i.e. it may have a number of bad bits that is within the capacity of the ECC scheme to correct with a high confidence level). Examples of ways of dealing with read errors may be found in U.S. Pat. No. 5,532,962.

Certain read failure modes are common to both 2-D memories and 3-D memories, while other failure modes are specific to 3-D memories. In general, the arrangement of components in three dimensions gives additional possibilities for short circuits or leakage between components that are designed to be isolated (e.g. because of defects in dielectrics). While a particular line, such as a word line, in a 2-D memory may have a possibility of shorting to neighboring word lines on either side, a line in a 3-D memory could also short to neighbors above or below. In addition, the complex geometry of 3-D memories and the difficult process requirements can make defects more likely in a 3-D memory. While ECC may be able to deal with a small number of bad bits, large groupings of bad bits such as caused by shorted or leaky components may not be correctable by ECC. For example, if a word line is shorted to another component, there may be a large number of bad bits along the word line so that data along the word line may be UECC.

It has been found that certain failure modes provide patterns of bad data that may be addressed by approaches that are directed to those particular patterns. Such patterns may be a result of the physical structure of a 3-D memory. While some defects may only affect a single cell, a small number of cells, or a single word line, other defects may affect a larger unit of the memory array. By determining the extent of the UECC data, a suitable approach may be identified to deal with the UECC data without affecting other data.

For example, in some cases a defect may cause data throughout a set of strings to be UECC while leaving data in other sets of strings unaffected. FIG. 10 shows an example where stored data throughout String X is UECC while data in other sets of strings in the same block (String X−1, String X−2 . . . etc. and String X+1, String X+2 . . . etc.) is correctable by ECC. It will be understood that the cross section of FIG. 10 shows a single representative string from each set and that a set of strings, such as String X is formed of all strings that share the same select lines. The term "String X" may refer herein to all strings having number "X" in a block, i.e. to a set of strings aligned in the y-direction that share a select line, or select lines (e.g. SGS and SOD).

Data may be UECC throughout String X as a result of some particular failure mode that affects String X but does not affect other strings. In other examples, failure modes may cause data in two neighboring strings to become UECC while data in other strings in the same block remains correctable by ECC. For example, a short between select lines of neighboring strings may cause data of two strings to become UECC. In FIG. 10, a short between SGD of String X and SGD of String X+1 could cause data of both String X and String X+1 to become UECC while data of all other strings in the block remain unaffected.

According to an example, when UECC data is encountered along a word line of a particular set of strings, a determination is made as to whether stored data is UECC throughout the set of strings. This may be achieved by reading data of one or more other word lines in the set of strings using the same read conditions and performing ECC decoding of the read data. Thus, if data of WL0 of a particular string is UECC, then, for example, WL20 and WL40 of the same string in the same block might be read to see if data stored there is also UECC. A suitable sample may be selected randomly or according to a predetermined pattern. Data may be considered UECC throughout the set of strings if more than a threshold number of word lines contain data that is UECC. Typically, such reading is performed using some default set of read conditions. Subsequently, one or more modified sets of read conditions may be used to attempt to find read conditions that provide ECC correctable data.

Various conditions may be changed in order to find a set of read conditions that provide ECC correctable data. For example, the voltage applied to a selected word line may be modified. The voltage applied to an unselected word line (read-pass voltage) in a selected set of strings may be modified. Such a read-pass voltage may be modified for either a dummy word line or a host data word line, or both. The voltage applied to one or both select lines (SGS, SGD) may be modified. The voltage applied to the back gate may be modified. Voltages applied to neighboring unselected blocks that share the same block select circuits may be modified (discussed below). Combinations of conditions, including these and other conditions, may be modified together. Modification may proceed according to a predetermined pattern, or based on some feedback from one iteration to another (e.g. using ECC results to indicate whether a particular modification provided better or worse results). In general, such modification may proceed up to some limit which may be a maximum time, a maximum number of iterations, or some other limit. If successful read conditions (conditions resulting in ECC correctable data) are not found within the limit, then some other approach may be used to obtain the required data (e.g. data may be recovered from redundancy data stored elsewhere).

If successful read conditions are found then the successful read conditions may be stored for use in any later reads of data from String X. While reads from other strings may continue to be performed using a default set of read conditions, the memory system may record that String X requires a modified set of read conditions. Thus, the solution to UECC within a particular set of strings is applied to the particular set of strings without affecting other sets of strings.

Recording of successful read conditions may be performed either on-chip in the same integrated circuit that contains the memory array (memory die), or off-chip in another integrated circuit. For example, where a memory controller, or Application Specific Integrated Circuit (ASIC), is connected to the memory die, successful read conditions may be recorded by the controller and may be sent by the controller whenever a read command is addressed to the set of strings.

FIG. 11 is a flowchart showing a scheme for dealing with UECC data as described above. When data is determined to be UECC 151, a determination is made as to whether data is UECC throughout the set of strings containing the data 153. If data is not UECC throughout the set of strings then a solution may be found that is specific to a word line or other smaller portion of data 155 (e.g. using redundancy data to reconstruct the portion of data). If data is UECC throughout the set of strings then modified read conditions are applied to obtain UECC correctable data 157. When successful read conditions are found, they are stored for later use throughout the set of strings 159.

Aspects of the present invention may be applied to units of data other than a set of strings. In general, when UECC data is found a determination may be made as to whether data is UECC throughout some larger unit containing the data. For example, a determination may be made as to whether data is UECC throughout a set of strings (as described above), throughout a block, throughout some group of blocks, or throughout some other unit.

FIG. 12 is a flowchart illustrating certain aspects of methods of dealing with UECC data. When data is found to be UECC 261 when read using certain read conditions, a determination is made as to whether data is UECC throughout some larger unit when read using those read conditions 263. If data is not UECC throughout a larger unit (e.g. specific to a word line) then a different solution may be applied that is specific to the data that is UECC 265 (e.g. specific to an individual word line). If it is UECC throughout a larger unit, modified read conditions are applied to find successful read conditions 267. These successful read conditions are then recorded for use throughout the larger unit 269.

Figure 13:
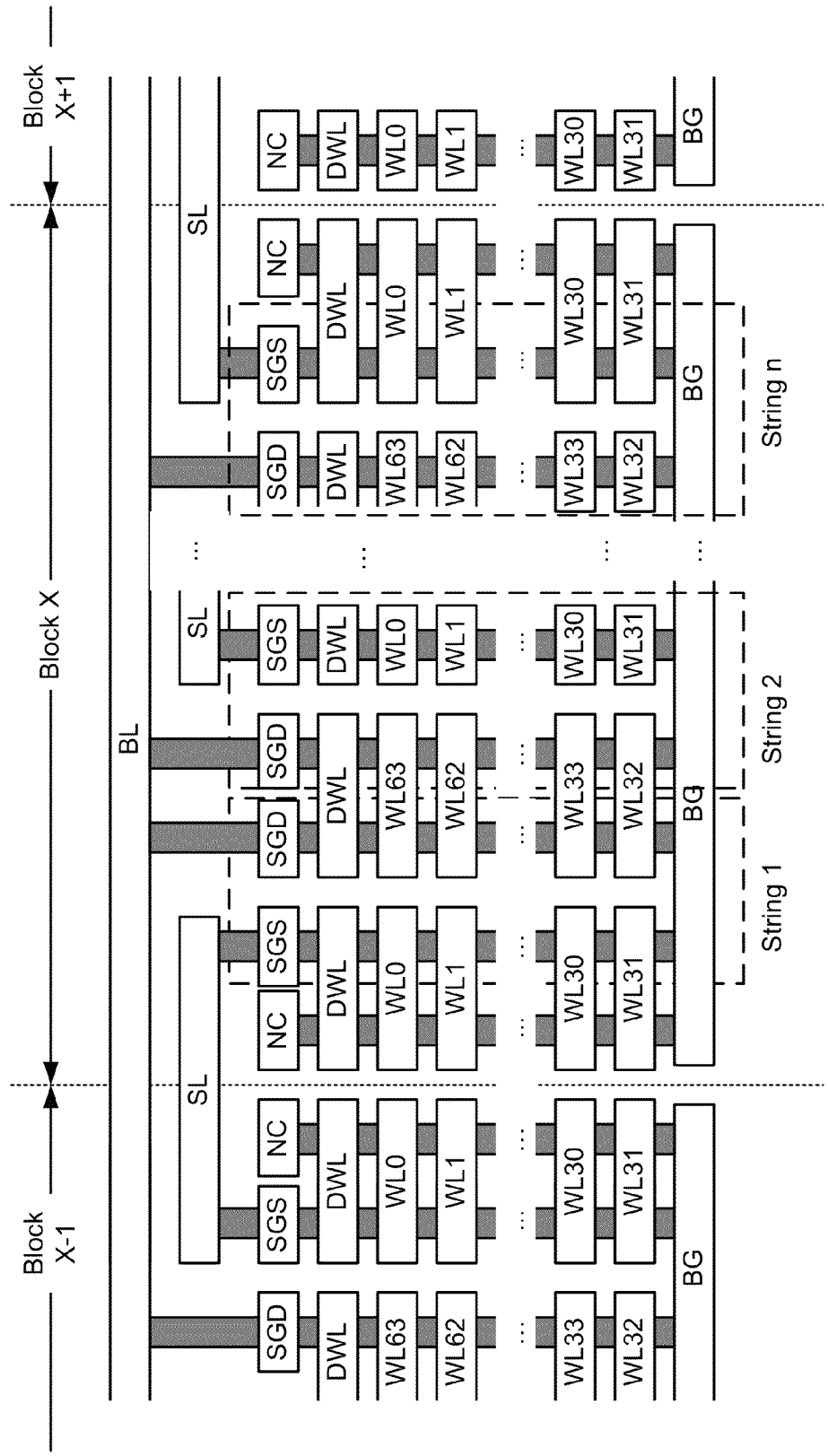
FIG. 13 illustrates an example of a block, Block X, that is determined to contain UECC data throughout the block.

FIG. 13 illustrates a block, Block X, that contains data that is UECC throughout the block when read using default read conditions. Block X consists of n strings (strings 3 to n−1 are omitted in FIG. 13) which contain UECC data. Thus, in this case, UECC data is not confined to a particular set of strings within the block but extends throughout all strings 1-n of the block. Therefore, a solution in this example is applied to the entire block. In particular, when it is determined that data is UECC throughout Block X using default read conditions, and modified read conditions are applied to find successful read conditions, the successful read conditions are recorded for subsequent reads of data throughout Block X. Other blocks, such as Block X−1 and Block X+1 may continue to be read using default read conditions.

In some cases, two or more blocks may share block select circuits. Examples of such shared block select circuits are shown in U.S. Patent Publication No. 2011/0267885. For example, Block X and Block X+1 could share a block select circuit in some memory designs and may be considered paired blocks for selection purposes. Such paired, or grouped (may more than two) blocks may have particular failure modes that affect a pair or group of blocks as a unit.

Figure 14:
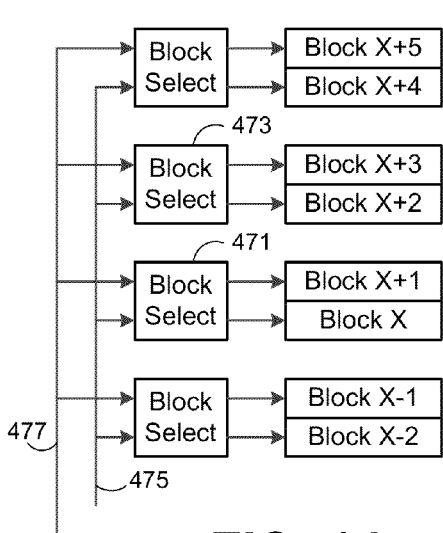
FIG. 14 illustrates how a plurality of blocks may share block select circuits.

FIG. 14 shows an example of paired blocks, where each pair of blocks share block select circuits. For example, Block X and Block X+1 share a block select circuit 471. Block X+2 and Block X+3 share a block select circuit 473, and so on. When particular data is accessed, a particular word line, set of strings containing the word line, and block containing the set of strings are selected. Block select circuits connect word lines of the selected block (e.g. Block X) to first global word lines 475 that are biased appropriately with read and read-pass voltages. The shared block select circuits 471 connect word lines of the unselected paired block (e.g. Block X+1) to separate second global word lines 477 that are biased to some low voltage. In some cases, a short or leak between blocks may affect reads in both blocks. For example, it can be seen from FIG. 9A that a short or leak between WL0 of Block X and WL0 of Block X+1 could occur if insulation between blocks was insufficient. Because of the connected word lines within a block, such a defect would affect all strings of the two blocks. For example, in order to read a word line of a string of Block X, it might be necessary to apply a read-pass voltage to WL0. If WL0 of Block X leaks to WL0 of Block X+1 (which is typically at some lower voltage than the read-pass voltage) then the effective voltage on WL0 of Block X may not be sufficient to make memory cells along WL0 conductive and may result in UECC data throughout Block X and Block X+1. For blocks that are not paired, word lines of the unselected block would generally be floating (isolated from global word lines) and leakage to such word lines would not significantly affect voltages applied to the selected block.

Modified read conditions for such UECC data may include modified voltages applied to any block sharing block select circuits. For example, instead of applying some low voltage to word lines of a paired block, a higher voltage may be used that is equal, or closer to, the read-pass voltage of the selected block so that any leakage is eliminated or reduced. Voltages applied to dummy and/or host data word lines may be modified in this manner. While it is possible to always apply higher voltages to unselected blocks that share block select circuits with selected blocks, this may result in significant power consumption and is not generally desirable. Accordingly, modified voltages may be applied to unselected blocks only where UECC data has actually been found, while lower voltages are applied to unselected blocks grouped with selected blocks in all other cases.

While this example refers to word lines, shorting of other elements between blocks may also result in UECC data throughout a pair of blocks. For example, shorts may occur between dummy word lines in a partial string along a block boundary. Shorts may occur between back gates of neighboring blocks. Shorts may occur between select lines of neighboring blocks (which may not be significant if they are not connected, but may be significant if they are connected).

Figure 15:
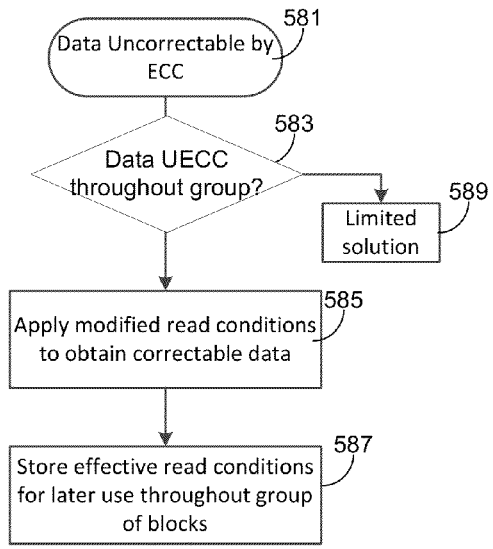
FIG. 15 illustrates a method of dealing with UECC data throughout a group of blocks that share block select circuits.

FIG. 15 is a flowchart illustrating an example of dealing with UECC data. When UECC data is encountered 581, a determination is made as to whether data is UECC throughout a group (e.g. a pair) of blocks that share block select circuits 583. If data is UECC throughout the group, then modified read conditions are applied to obtain ECC correctable data 585. The successful read conditions are stored for later use throughout the group of blocks 587. Such conditions may include different voltages applied to the unselected block or blocks within the group in addition to (or instead of) different voltages applied to the selected block. If data is not UECC throughout the group of blocks then a more limited solution is applied 589.

Various schemes above may be combined in various ways. For example, when UECC data is found, a series of determinations may be made as to whether data is uncorrectable throughout a set of strings, and if so whether it is uncorrectable throughout a block, and if so whether it is uncorrectable throughout a group of blocks. Thus, the largest unit throughout which data is UECC may be identified and appropriate action taken to address the problem throughout the affected unit.

Figure 16:
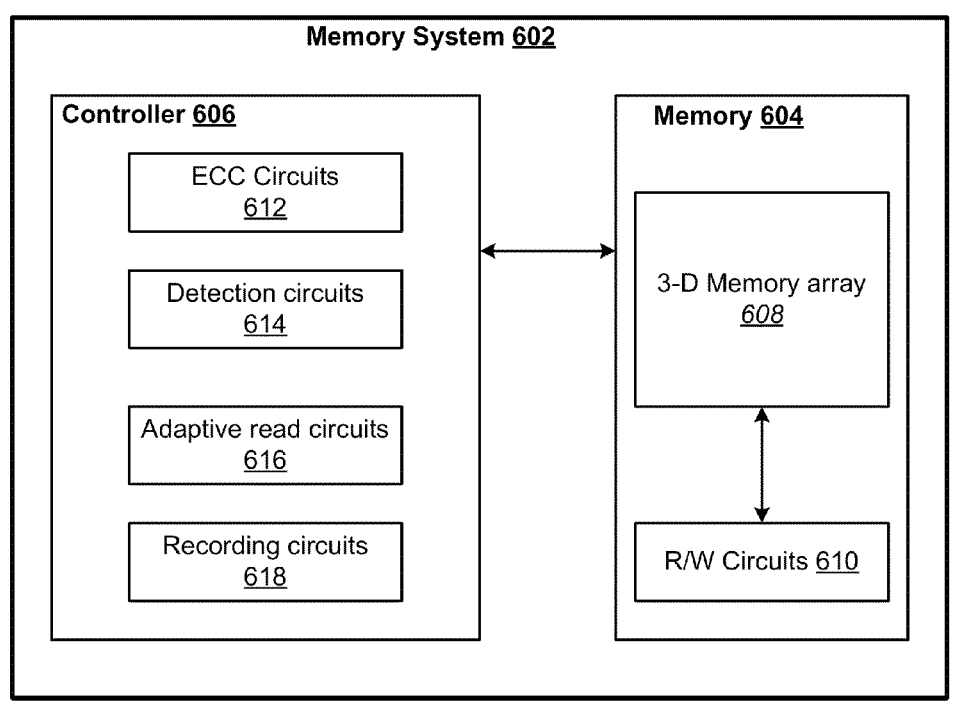
FIG. 16 shows an example of hardware components that may be used to implement various methods of dealing with UECC data.

FIG. 16 shows an example of hardware that may be used to implement some of the methods described above. In particular, FIG. 16 shows a memory system 602 that includes a memory die 604 and a controller die 606. The memory die includes a memory array 608 and read/write circuits 610. When the controller receives a read command from a host it uses read/write circuits 610 to access particular data. Memory controller 606 includes ECC circuits 612 for decoding data sent by read/write circuits 610. In the event that data from read/write circuits 610 is found by ECC circuits 612 to be uncorrectable, detection circuits 614 may send additional read requests to read/write circuits 610 to determine if data is UECC throughout some larger unit or units. If data is UECC throughout some larger unit then adaptive read circuits 616 may send one or more additional read requests to read/write circuits 610 with different sets of read conditions. A series of such read requests may be sent with different read conditions until data is returned that is correctable by ECC circuits 612. When successful read conditions are found, the data as corrected by ECC circuits 612 is sent to the host and the successful read conditions are recorded in recording circuits 618. It will be understood that additional components are present in memory system 602. Such additional components may include conventional components shown in FIG. 1. The various circuits described here may be dedicated circuits formed in an ASIC, programmable logic circuits configured for a specific purpose, or may be implemented using general purpose circuits that are configured for a specific purpose through firmware, or some combination.

While the description above refers to particular examples of units within particular three dimensional nonvolatile memory arrays, it will be understood that aspects of the invention may be applied to different units in different memory systems. Furthermore, while particular read conditions are discussed with respect to the examples above, any suitable read condition may be modified in order to obtain ECC correctable data.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three dimensional nonvolatile NAND memory comprising:
applying a first set of read conditions to a first portion of a block to obtain first data;
performing Error Correction Code (ECC) decoding of the first data;
determining that the first data is uncorrectable by ECC;
in response to determining that the first data in the first portion of the block is uncorrectable by ECC, determining whether a larger unit within the three dimensional NAND memory, that is larger than the first portion of the block, is uncorrectable by ECC when read using the first set of read conditions, the larger unit consisting of: a set of strings within the block, the set of strings consisting of fewer than all strings of the block that are selected together by a common select line while other sets of strings within the block remain unselected and isolated by other select lines;
if the stored data is uncorrectable by ECC throughout the larger unit, then applying modified read conditions to the first portion of the block to find a second set of read conditions that provide second data that is correctable by ECC; and
returning corrected second data and recording the second set of read conditions for subsequent reads of data of the set of strings while continuing to use a default set of read conditions for the other sets of strings within the block.

2. The method of claim 1 wherein the first set of read conditions includes a first read voltage applied to a selected word line and the second set of read conditions includes a second read voltage applied to the selected word line, the second read voltage being different to the first read voltage.

3. The method of claim 1 wherein the first set of read conditions includes a first read-pass voltage applied to unselected word lines and the second set of read conditions includes a second read-pass voltage applied to the unselected word lines, the second read-pass voltage being different to the first read-pass voltage.

4. The method of claim 1 wherein the first set of read conditions includes a first select voltage applied to a select line and the second set of read conditions includes a second select voltage applied to the select line, the second select voltage being different to the first select voltage.

5. The method of claim 1 wherein the first set of read conditions includes a first unselect voltage applied to a select line of an unselected set of strings and the second set of read conditions includes a second unselect voltage applied to the select line of the unselected set of strings, the second unselect voltage being different to the first unselect voltage.

6. The method of claim 1 wherein the first set of read conditions includes a first read-pass voltage applied to a dummy word line and the second set of read conditions includes a second read-pass voltage applied to the dummy word line.

7. The method of claim 1 wherein the first set of read conditions includes a first voltage provided to a host data word line, a dummy word line, and/or a select line of an unselected block that shares block select circuits with the block and the second set of read conditions includes a second voltage provided to the host data word line, the dummy word line, and/or the select line of the unselected block, the second voltage being different to the first voltage.

8. The method of claim 7 wherein the first and second voltages are provided to word lines of the unselected block and the second voltage is higher than the first voltage.

9. The method of claim 1 wherein, if more than a threshold number of modified read conditions are applied to the first portion of the block without finding the second set of read conditions that provide second data that is correctable by ECC, then recovering data of the first portion of the block from redundancy data stored in other blocks.

10. A method of operating a three dimensional nonvolatile NAND memory in which each block includes a plurality of strings connected to each bit line, each string along a bit line being selectable by a different select line so that an individual select line selects a set of strings of different bit lines, comprising:
applying a select voltage to a select line of a selected set of strings in a block while applying an unselect voltage to other select lines of unselected sets of strings in the block;
applying a first set of read conditions to a selected word line of the selected set of strings to obtain first data;
performing Error Correction Code (ECC) decoding of the first data;
determining that the first data is uncorrectable by ECC;
in response to determining that the first data is uncorrectable by ECC, determining whether stored data is uncorrectable throughout the selected set of strings;

if the stored data is uncorrectable throughout the selected set of strings, then applying modified read conditions to the selected word line of the selected set of strings to find a second set of read conditions that provide second data that is correctable by ECC; and returning corrected second data and recording the second set of read conditions for subsequent reads of data in the selected set of strings while leaving read conditions for subsequent reads of data in other sets of strings in the block unchanged.

11. The method of claim 10 wherein the determining whether stored data is uncorrectable throughout the selected set of strings includes attempting to read one or more additional word lines within the selected set of strings using the first set of read conditions.

12. The method of claim 10 further comprising determining whether stored data in a block containing the selected set of strings is uncorrectable by ECC throughout the block when read using the first set of read conditions.

13. The method of claim 12 wherein, if stored data is uncorrectable by ECC throughout the selected set of strings, and is not uncorrectable by ECC throughout the block when read using the first set of read conditions, then recoding the second set of read conditions for subsequent reads of data in the first set of strings while maintaining the first set of read conditions for subsequent reads of other sets of strings in the block.

14. A method of operating a three dimensional nonvolatile NAND memory comprising:

applying a first set of read conditions to a first portion of a block to obtain first data;

performing Error Correction Code (ECC) decoding of the first data;

determining that the first data is uncorrectable by ECC;

in response to determining that the first data is uncorrectable by ECC, determining whether stored data is uncorrectable by ECC throughout a plurality of blocks, including the block, that share block select circuits;

if the stored data is uncorrectable by ECC throughout the plurality of blocks, then applying modified read conditions to the first portion of the block to find a second set of read conditions that provide second data that is correctable by ECC; and returning corrected second data and recording the second set of read conditions for subsequent reads of data throughout the plurality of blocks that share block select circuits.

15. The method of claim 14 wherein the first set of read conditions includes a first voltage provided to a host data word line, a dummy word line, and/or a select line of an unselected block of the plurality of blocks and the second set of read conditions includes a second voltage provided to the host data word line, the dummy word line, and/or the select line of the unselected block, the second voltage being different to the first voltage.

16. The method of claim 15 wherein the first voltage and the second voltage are provided to a word line of the unselected block and the second voltage is higher than the first voltage.

17. The method of claim 15 wherein the first voltage and the second voltage are provided to a select line of the unselected block and the second voltage is higher than the first voltage.

18. A three dimensional nonvolatile NAND memory system comprising:

a three dimensional nonvolatile NAND memory array;

Error Correction Code (ECC) circuits that decode data read from a portion of a block of the nonvolatile NAND memory array;

determination circuits that, in response to determining that the data read from the portion of the block is uncorrectable by ECC when read using a first set of read conditions, determine whether data throughout a larger unit within the three dimensional nonvolatile NAND memory array, that is larger than the portion of the block, is uncorrectable by ECC when read using the first set of read conditions, the larger unit consisting of: a set of strings within the block that are selected together by a common select line while other sets of strings within the block remain unselected and isolated by other select lines;

adaptive read circuits configured to apply modified read conditions to find a second set of read conditions that provide data that is correctable by ECC if data is uncorrectable by ECC throughout the larger unit when read using the first set of read conditions; and recording circuits that record the second set of read conditions for subsequent reads of data of the set of strings while continuing to use a default set of read conditions for the other sets of strings within the block.

19. The three dimensional nonvolatile NAND memory system of claim 18 wherein the three dimensional nonvolatile NAND memory array is located on a memory die and the recording circuits are located on a separate memory controller die.

20. The three dimensional nonvolatile NAND memory system of claim 19 wherein the recording circuits are implemented on the memory controller die using firmware.

21. The three dimensional nonvolatile NAND memory system of claim 18 wherein the first set of read conditions includes a first read voltage applied to a selected word line and the second set of read conditions includes a second read voltage applied to the selected word line, the second read voltage being different to the first read voltage.

22. The three dimensional nonvolatile NAND memory system of claim 18 wherein the first set of read conditions includes a first read-pass voltage applied to unselected word lines and the second set of read conditions includes a second read-pass voltage applied to the unselected word lines, the second read-pass voltage being different to the first read-pass voltage.

23. The three dimensional nonvolatile NAND memory system of claim 18 wherein the first set of read conditions includes a first select voltage applied to a select line and the second set of read conditions includes a second select voltage applied to the select line, the second select voltage being different to the first select voltage.

24. The three dimensional nonvolatile NAND memory system of claim 18 wherein the first set of read conditions includes a first unselect voltage applied to a select line of an unselected set of strings and the second set of read conditions includes a second unselect voltage applied to the select line of the unselected set of strings, the second unselect voltage being different to the first unselect voltage.

25. The three dimensional nonvolatile NAND memory system of claim 18 wherein the first set of read conditions includes a first read-pass voltage applied to a dummy word line and the second set of read conditions includes a second read-pass voltage applied to the dummy word line.

26. The three dimensional nonvolatile NAND memory system of claim 18 wherein the first set of read conditions includes a first voltage provided to a host data word line, a dummy word line, and/or a select line of an unselected block that shares block select circuits with the block and the second set of read conditions includes a second voltage provided to the host data word line, the dummy word line, and/or the select line of the unselected block, the second voltage being different to the first voltage.

27. The three dimensional nonvolatile NAND memory system of claim 26 wherein the first and second voltages are provided to word lines of the unselected block and the second voltage is higher than the first voltage.

28. The three dimensional nonvolatile NAND memory system of claim 18 wherein, if more than a threshold number of modified read conditions are applied to the first portion of the block without finding the second set of read conditions that provide second data that is correctable by ECC, then data of the first portion of the block is recovered from redundancy data stored in other blocks.

29. A three dimensional nonvolatile NAND memory system comprising:
  a plurality of individually erasable blocks, a block including a plurality of strings connected to each bit line of the block, each string along a bit line being selectable by a different select line so that an individual select line selects a set of strings of different bit lines;
  Error Correction Code (ECC) circuits that decode data read from a portion of a selected set of strings of a selected block;
  determination circuits that, in response to determining that the portion of data is uncorrectable by ECC when read using a first set of read conditions, further determine whether stored data is uncorrectable throughout the selected set of strings;
  adaptive read circuits that apply modified read conditions to find a second set of read conditions that provide data that is correctable by ECC; and
  recording circuits that record the second set of read conditions for subsequent reads of data in the selected set of strings, the recording circuits having an individual record for the set of strings and other records for other sets of strings of the block.

30. The three dimensional nonvolatile NAND memory system of claim 29 wherein the plurality of individually erasable blocks are located on a memory die and the recording circuits are located on a separate memory controller die.

31. The three dimensional nonvolatile NAND memory system of claim 29 wherein the determination circuits further determine whether stored data is uncorrectable by ECC throughout the selected set of strings by attempting to read one or more portions within the selected set of strings using the first set of read conditions.

32. The three dimensional nonvolatile NAND memory system of claim 29 wherein the determination circuits further determine whether stored data in a block containing the selected set of strings is uncorrectable by ECC throughout the block when read using the first set of read conditions.

33. The three dimensional nonvolatile NAND memory system of claim 32 wherein, if stored data is uncorrectable by ECC throughout the selected set of strings, and is not uncorrectable by ECC throughout the block when read using the first set of read conditions, the second set of read conditions is recorded by the recording circuits for subsequent reads of data in the first set of strings while the first set of read conditions is maintained for subsequent reads of other sets of strings in the block.

34. A three dimensional nonvolatile NAND memory system comprising:
  a plurality of individually erasable blocks that are configured in selectable units of two or more blocks that share block select circuits;
  Error Correction Code (ECC) circuits that decode data read from a portion of a selected block in a selectable unit;
  determination circuits that, in response to determining that the portion of data is uncorrectable by ECC when read using a first set of read conditions, further determine whether stored data is uncorrectable throughout the selectable unit that contains the selected block;
  adaptive read circuits that apply modified read conditions to find a second set of read conditions that provide data that is correctable by ECC when applied to the portion of the selected block; and
  recording circuits that record the second set of read conditions for subsequent reads of data in the selectable unit that contains the selected block based on providing data that is correctable by ECC when applied to the portion of the selected block, without applying the second set of read conditions to other portions of the selectable unit.

35. The three dimensional nonvolatile NAND memory system of claim 34 wherein the plurality of individually erasable blocks are located on a memory die and the recording circuits are located on a separate memory controller die.

36. The three dimensional nonvolatile NAND memory system of claim 34 wherein the first set of read conditions includes a first voltage provided to a host data word line, a dummy word line, and/or a select line of an unselected block of the selectable unit and the second set of read conditions includes a second voltage provided to the host data word line, the dummy word line, and/or the select line of the unselected block, the second voltage being different to the first voltage.

37. The three dimensional nonvolatile NAND memory system of claim 36 wherein the first voltage and the second voltage are provided to a word line of the unselected block and the second voltage is higher than the first voltage.

38. The three dimensional nonvolatile NAND memory system of claim 36 wherein the first voltage and the second voltage are provided to a select line of the unselected block and the second voltage is higher than the first voltage.

* * * * *